United States Patent
Meis

(10) Patent No.: US 9,130,326 B2
(45) Date of Patent: Sep. 8, 2015

(54) DEVICE FOR SUPPLYING ELECTRICAL ENERGY TO A LOAD, AND SYSTEM THEREFOR

(75) Inventor: Alfons Meis, Dorsten (DE)

(73) Assignee: DULA-WERKE DUSTMANN & CO. GMBH, Dortmund (DE)

(*) Notice: Subject to any disclaimer, the term of this patent is extended or adjusted under 35 U.S.C. 154(b) by 0 days.

(21) Appl. No.: 14/365,531

(22) PCT Filed: Dec. 14, 2011

(86) PCT No.: PCT/EP2011/006306
§ 371 (c)(1),
(2), (4) Date: Jun. 13, 2014

(87) PCT Pub. No.: WO2013/087081
PCT Pub. Date: Jun. 20, 2013

(65) Prior Publication Data
US 2014/0349502 A1   Nov. 27, 2014

(51) Int. Cl.
*H01R 4/60* (2006.01)
*H01R 25/14* (2006.01)
(Continued)

(52) U.S. Cl.
CPC ............ *H01R 25/14* (2013.01); *A47B 57/40* (2013.01); *A47B 97/00* (2013.01); *H01R 25/16* (2013.01); *H05K 1/118* (2013.01); *A47B 2220/0077* (2013.01); *A47F 5/103* (2013.01); *H05K 2201/09145* (2013.01); *H05K 2201/10189* (2013.01); *H05K 2201/2009* (2013.01)

(58) Field of Classification Search
CPC .......... H01R 4/64; H01R 9/2675; H01R 9/26; H01R 9/2608; H01R 13/504; H01R 25/14; H01R 25/16; H01R 25/162; H01R 25/142; H01R 25/00; H01R 31/06; H01R 33/88; H01R 33/94
USPC .......................... 439/212, 110–121, 207, 638
See application file for complete search history.

(56) References Cited

U.S. PATENT DOCUMENTS 884,426 A * 4/1908 Lawrencs ..................... 415/188
1,047,353 A * 12/1912 Weismann .................... 439/541
(Continued)

FOREIGN PATENT DOCUMENTS

DE   202009005428 A   10/2003
DE   202006006185 A   8/2007
(Continued)

*Primary Examiner* — Neil Abrams
*Assistant Examiner* — Travis Chambers
(74) *Attorney, Agent, or Firm* — Lucas & Mercanti, LLP; Klaus P. Stoffel

(57) ABSTRACT

A device for supplying electrical energy to a load. A supporting element made of electrically insulating material is provided, which has at least one electrical strip conductor formed from an electrically conductive layer. At least one electrically conductive contact face per strip conductor is provided on the source side, via which the strip conductor is contactable with the voltage source. A flat plug that includes the load-side ends of the strip conductors is provided on the supporting element and effects the electrical connection to the load. A system for electrification of an electrical load on a furniture item is provided. At least one device, a support and at least one vertical profile are provided. The device is mounted on the support and the strip conductors of the support are electrified by inserting the support into the profile. For that purpose, the profile has at least one vertically arranged conductor rail.

14 Claims, 1 Drawing Sheet

(51) Int. Cl.
*H01R 25/16* (2006.01)
*A47B 97/00* (2006.01)
*H05K 1/11* (2006.01)
*A47B 57/40* (2006.01)
*A47F 5/10* (2006.01)

(56) References Cited

U.S. PATENT DOCUMENTS

| | | | | |
|---|---|---|---|---|
| 1,064,983 | A * | 6/1913 | Murray | 607/91 |
| 3,128,344 | A * | 4/1964 | Goold | 108/50.02 |
| 4,969,827 | A | 11/1990 | Hahs, Jr. | |
| 4,974,121 | A | 11/1990 | Masuko et al. | |
| 5,129,835 | A * | 7/1992 | DeFouw et al. | 439/215 |
| 5,348,485 | A * | 9/1994 | Briechle et al. | 439/110 |
| 6,200,146 | B1 | 3/2001 | Sarkissian | |
| 6,364,678 | B1 * | 4/2002 | Hellwig et al. | 439/211 |
| 7,497,711 | B2 * | 3/2009 | Gherardini et al. | 439/212 |
| 8,512,051 | B2 * | 8/2013 | Chiu et al. | 439/76.1 |
| 8,979,296 | B2 * | 3/2015 | Wiemer et al. | 362/125 |
| 2006/0228913 | A1 | 10/2006 | Jiang et al. | |
| 2008/0043456 | A1 * | 2/2008 | Bernardini et al. | 362/94 |
| 2011/0227356 | A1 | 9/2011 | Oberg | |

FOREIGN PATENT DOCUMENTS

| | | |
|---|---|---|
| EP | 0472420 | 2/1992 |
| EP | 2242349 | 10/2010 |
| GB | 2356295 | 5/2001 |
| WO | 2007122069 | 11/2007 |

* cited by examiner

DEVICE FOR SUPPLYING ELECTRICAL ENERGY TO A LOAD, AND SYSTEM THEREFOR

The present application is a 371 of International application PCT/EP2011/006306, filed Dec. 14, 2011, the priority of this application is hereby claimed and this application is incorporated herein by reference.

BACKGROUND OF THE INVENTION

The invention pertains to a device for supplying electrical energy to a load and to a system for electrifying at least one load by the use of a device of this type. Such devices are used to supply a load with electrical energy, for example. In particular, the load can be a lamp, a display, a loudspeaker, or even a ballast for another electrical load. The devices are often used in store fixtures, exhibition booth constructions, and generally in the field of interior furnishing.

EP 2 242 349 A2 describes a device for supplying electrical energy to a load. This device can also be used in store fixtures, exhibition booth constructions, and interior furnishing to provide lamps, for example, with electrical energy. The disadvantage of this device, however, is that the load must be connected to the load-side contact surfaces. This is usually done by means of soldering. Such soldered connections, however, must be produced by an expert. In addition, it can often happen that the soldering has weak spots. In addition, it is almost impossible to connect a different load to the device, because the soldered connection of the old load must be taken apart and any solder residues must be removed before a new load can be connected again by soldering.

SUMMARY OF THE INVENTION

The goal of the invention is therefore to improve the device described above and to make it usable by non-experts. Another goal of the invention is to make available a system for electrifying loads.

A plug is provided on the support element; this plug comprises the load-side ends of the strip conductor and serves to establish an electrical connection with the load. This arrangement offers the advantage that anyone, even unskilled workers, can connect the load to the support element. Defects such as those attributable to poor soldering can also be avoided. The loads which are to be supplied with electrical energy by way of the device are also very easy to replace, a job requiring only a few manual procedures.

In the case of a system for electrification, at least one carrier is also provided in addition to the previously described device comprising a plug; this carrier can be the furniture element itself such as a hanger bracket, or it can carry a furniture element such as the bottom of a shelving unit, a clothes rod, or the like. On the carrier or furniture element, . . . can be attached directly or indirectly to the load. A vertical profiled section is also provided, which is preferably arranged in a housing and on which the carrier in question can be arranged. The profiled section comprises at least one, preferably two, busbars. The device can be attached to the carrier by means of an adhesive, for example, although it would also be possible to connect it by soldering, welding, riveting, or by some other type of connecting method, and the conductors on the support element and the plug of the device are then electrified by hooking or hanging the carrier onto the profiled section or by plugging it into the profiled section. It is obviously also possible to attach the carrier to the profiled section in some other way. The plug is preferably connected undetachably to the support element. It is especially advantageous in this case for the plug to have an almost completely flat design, so that the system is almost invisible after it has been fully assembled. It is especially preferable to integrate the plug directly into the support element when the support element is being fabricated.

The plug is preferably designed as a female plug. This avoids damage to the plug contacts and prevents them from being bent when the device is being mounted on the carrier.

In an especially preferred exemplary embodiment, the plug is designed in such a way that the corresponding mating plug belonging to it can be inserted in only one direction. Because the device is almost always used with direct current, this has the result of preventing the poles from being reversed. Depending on the type of load, reversing the polarity could be a problem and could lead to damage to the load. So that the mating plug can be inserted in only one direction, it is possible, for example, to design the shape of the female plug so that the contacts are different or so that the plug itself does not have a completely symmetrical shape, with the result that the mating plug fits into it only when oriented in one direction.

In an especially preferred exemplary embodiment, the support element has a flexible design. Thus it can be adapted to carriers of different shapes. A piece of plastic sheet can be used as the support element, for example. This can carry the strip conductors, which can consist of tin-plated copper foil, for example. A support element configured in this way can then be used for many different applications.

In another preferred exemplary embodiment, the support element comprises a pressure-sensitive adhesive layer on one side and/or an electrically insulating protective layer on the other side. If both layers are provided, the support element can be bonded very easily to the carrier. A short-circuit between the conductive pathways of the support element can also be easily avoided by providing an insulating protective layer. When the device is being put into service or when a load is being replaced, the operator can therefore touch the support element in the area of the strip conductors without causing a short circuit.

To design the system so that it is as inconspicuous as possible, the support elements and/or the adhesive layer and/or the protective layer can be transparent or colorless. When mounted on the carrier, the device can thus hardly be seen during normal use of the carrier on the piece of furniture. It can be thus be installed inconspicuously and does not impair the overall visual impression.

Additional advantages and embodiments of the invention can be derived from the following description, from the subclaims, and from the drawings. The drawings show an exemplary embodiment of the invention:

DETAILED DESCRIPTION OF THE INVENTION

Figure 1:
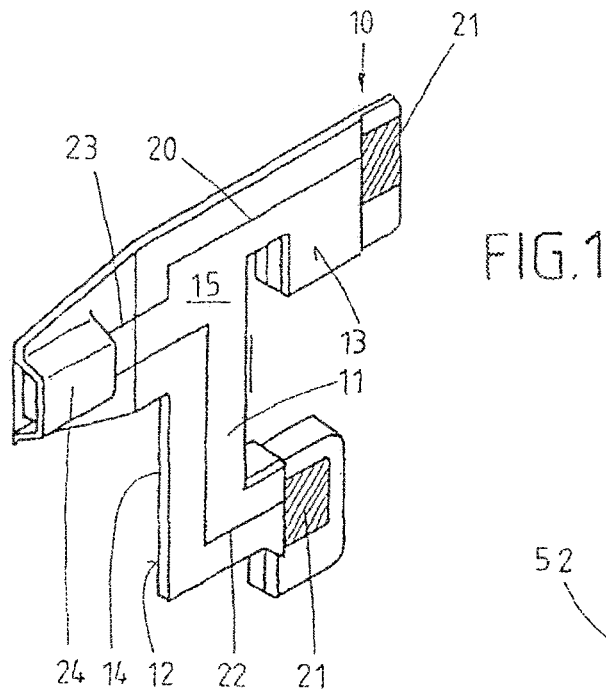
FIG. 1 shows a perspective view of the inventive device.

FIG. 1 shows the device 10. One can see the support element 11, consisting of a piece of plastic sheet material. One side 12 of the support element 11 is coated with a layer of adhesive 14 of the pressure-sensitive type, whereas the other side 13 of the device 11 is provided with a protective layer 15, which acts as an electrical insulator, so that a short circuit cannot occur between the two strip conductors 20. The device 10 also has a plug 24 and two contact surfaces 21, wherein each of the contact surfaces 21 is connected electrically to the plug 24 and by one of the strip conductors 20. The contact surfaces 21 are arranged on the source side 22 of the strip conductors 20, whereas the plug 24 is on the load side 23 of the strip conductors 20. The contact surfaces 21 are wider than their associated strip conductors 20. It is thus possible to provide the strip conductors 20 in as narrow and inconspicuous a fashion as possible on the support element 11, whereas the contact surfaces 21 are wide enough to guarantee reliable and simple contact on installation of the device 10 into a system.

Figure 2:
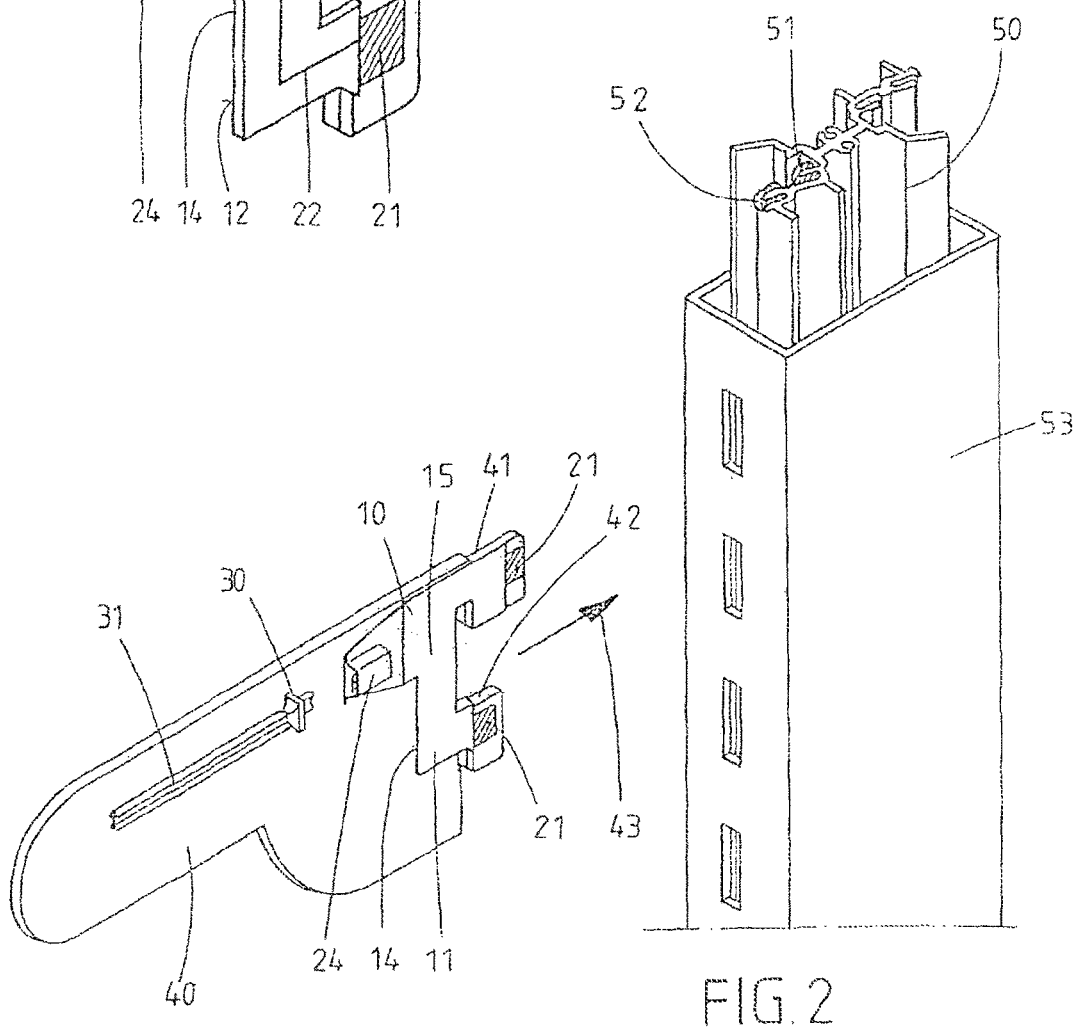
FIG. 2 shows perspective view of a system with the inventive device of FIG. 1.

A system of this type is shown in FIG. 2. The device 10 is mounted on a carrier 40. The support element 11 is attached to the carrier 40 by way of the pressure-sensitive adhesive layer 14. Of course, it is also possible to provide an adhesive layer which is not pressure-sensitive or to fasten the device 10 to the carrier 40 in some other way.

It is also possible to see an electrical connection 31, shown by way of example, which has a mating plug 30, which can be brought into electrically effective contact by simply plugging it in. Thus a load such as a lamp, a loudspeaker, a display, or the like arranged at the electrical connection 31 can be easily supplied with electrical energy.

The two contact surfaces 21 on the device 10, now mounted on the carrier 40, are still accessible. What this means will now be explained further. The system also comprises the profiled section 50, which comprises two busbars 51 and 52, namely, an outgoing rail 51 and a return rail 52. The profiled section 50 is arranged in a housing 53. The two busbars 51, 52 are parallel to each other and extend vertically through the profiled section 50 in such a way that the outgoing busbar 51 is behind the return busbar 52 in terms of the direction 43 in which the carrier is introduced. The carrier 40 comprises two tabs 41, 42, on which the contact surfaces 21 of the support element 11 are positioned after the device 10 has been mounted on the carrier. When the carrier 40 is introduced, these contact surfaces are easily brought into electrical contact with the busbars 51, 52 in the profiled section 50. The introduction of the carrier 40 into the profiled section 50 can be accomplished in particular by hooking the carrier 40 onto the section or by plugging it or hanging it in place.

In the preferred embodiment shown here, one tab 41, which can be brought into engagement with the outgoing busbar 51, is longer in the direction 43 in which the carrier 40 is introduced than the tab 42, which can be brought into engagement with the return busbar 52. Because of the different lengths of the tabs, it is ensured that there will be no short circuit between the busbars 51, 52 across the carrier 40. In addition, the system is also very flexible in design. Thus carriers 40 which do not have a device 10 and which therefore are not to be electrified can also be introduced into the profiled section 50. These carriers 40 will then comprise two shorter tabs 42, which, when the carrier 40 of this design is introduced into the profiled section 50, engage only with the return busbar 52. As a result, no short circuit can occur, and the non-electrified carrier 40 is also prevented from being under voltage, precisely because it cannot come in contact with the outgoing busbar 51.

In conclusion, it should be pointed out that the embodiments presented here are only exemplary realizations of the invention. The invention is not limited to them. On the contrary, variants and modifications are possible. For example, the carrier can have a different shape, and it does not have to be arranged in a plane. The profiled section, furthermore, can also be designed differently and does not necessarily have to be arranged in a housing. The shape of the device and of the plug can also vary. The exact designs and configurations depend on the concrete application.

LIST OF REFERENCE NUMBERS 10 device
11 support element
12 one side of 11
13 other side of 11
14 adhesive layer
15 protective layer
20 strip conductor
21 contact surface
22 source side of 20
23 load side of 20
24 plug
30 mating plug
31 electrical connection
40 carrier
41 a tab
42 other tab
43 direction in which 40 is introduced
50 profiled section
51 outgoing busbar
52 return busbar
53 housing

The invention claimed is:

1. A system for electrifying at least one electrical load on a furniture item in store fixtures, comprising:
at least one device for supplying electrical energy to the load, the device including a support element of electrically insulating material that carries at least one electrical strip conductor formed of an electrically conductive layer with an electrically conductive contact surface on a source side of the strip conductor, by which the strip conductor establishes contact with a voltage source, and a substantially flat plug that is provided on the support element and has the load-side end of the strip conductor, wherein electrical connection to the load is achieved via the plug;
at least one carrier and on which the load is mountable;
at least one vertical profiled section on which the carrier is mountable and which comprises two vertically arranged busbars; and
a housing, the profiled section being arranged in the housing, wherein the device is mountable on the carrier and the strip conductor on the support element is electrified by hooking the carrier onto, plugging it into, or hanging it on, the profiled section, wherein the support element comprises a layer of pressure-sensitive adhesive on one side and/or an electrically insulating protective layer on another side, and wherein the support element is flexible.

2. The system according to claim 1, wherein the plug is designed as a female plug.

3. The system according to claim 1, wherein the plug is connected to the support element by soldering, adhesive bonding, or welding or is an integral part of that element.

4. The system according to claim 1, wherein the plug is configured so that a mating plug is insertable in only one direction.

5. The system according to claim 1, wherein the support element and/or the pressure-sensitive adhesive layer and/or the protective layer is transparent and/or colorless.

6. The system according to claim 1, wherein the contact surface of the strip conductor is wider than the strip conductor itself.

7. The system according to claim 1, wherein the carrier comprises two tabs, on which, in a mounted state of the device, the two contact surfaces of the support element are positioned, and which, upon introduction of the carrier into the profiled section, are brought into electrically effective connection with the two busbars of the profiled section.

8. The system according to claim 1, wherein the support element is a plastic support sheet.

9. The system according to claim 1, wherein the support element carries two electrical strip conductors.

10. The system according to claim 1, wherein the carrier is a furniture element.

11. The system according to claim 1, wherein the carrier is configured to carry a furniture element.

12. The system according to claim 1, wherein one of the busbars is an outgoing busbar and another of the busbars is a return busbar, the outgoing busbar being arranged behind the return busbar in terms of a direction in which the carrier is introduced.

13. The system according to claim 12, wherein the carrier has two tabs, wherein a first tab is longer in the direction in which the carrier is introduced than a second tab.

14. The system according to claim 13, wherein the first tab is engagable with the outgoing busbar and the second tab is engagable with the return busbar.

* * * * *